(12) United States Patent
Narabu et al.

(10) Patent No.: US 6,310,369 B1
(45) Date of Patent: Oct. 30, 2001

(54) CHARGE-TO-VOLTAGE CONVERTER WITH ADJUSTABLE CONVERSION FACTOR

(75) Inventors: Tadakuni Narabu; Maki Sato; Yasuhito Maki, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 1135 days.

(21) Appl. No.: 08/789,519

(22) Filed: Jan. 27, 1997

Related U.S. Application Data

(63) Continuation of application No. 08/566,476, filed on Dec. 4, 1995, now abandoned, which is a continuation of application No. 08/323,052, filed on Oct. 19, 1994, now abandoned, which is a continuation of application No. 08/026,017, filed on Mar. 4, 1993, now abandoned.

(30) Foreign Application Priority Data

Mar. 4, 1992 (JP) .................................... 4-082707

(51) Int. Cl.⁷ ........................ H01L 24/148; H01L 29/768
(52) U.S. Cl. ......................... 257/239; 257/240; 257/315
(58) Field of Search .................... 257/239, 240, 257/315

(56) References Cited

U.S. PATENT DOCUMENTS

| | | | |
|---|---|---|---|
| 4,939,560 | * 7/1990 | Narabu et al. | 257/239 |
| 4,993,053 | * 2/1991 | Itoh et al. | 257/239 |
| 5,306,932 | * 4/1994 | Miwada | 257/239 |

FOREIGN PATENT DOCUMENTS

| | | | |
|---|---|---|---|
| 0 192 142 | 2/1986 | (EP) . | |
| 0 321 953 | 12/1988 | (EP) . | |
| 1 116 398 | 2/1983 | (GB) . | |
| 56-36162 | * 4/1981 | (JP) | 257/239 |
| 59-52877 | 9/1982 | (JP) . | |
| 58-130564 | * 8/1983 | (JP) | 257/239 |
| 60-050671 | * 8/1985 | (JP) | 257/239 |
| 62-49653 | * 3/1987 | (JP) | 257/239 |
| 62-245670 | * 10/1987 | (JP) | 257/239 |

* cited by examiner

*Primary Examiner*—Ngân V. Ngô
(74) *Attorney, Agent, or Firm*—Sonnenschein, Nath & Rosenthal

(57) ABSTRACT

In a floating diffusion output type or a floating gate output type charge-to-voltage converter, the floating diffusion or the floating gate is coupled to one or more diffusion regions by means of one or more switch elements, and such elements are selectively turned on or off in such a manner that the the charge-to-voltage conversion factor is raised to obtain a great voltage amplitude when a small quantity of signal charge is input, or the conversion factor is lowered to obtain a small voltage amplitude when a large quantity of signal charge is input.

1 Claim, 6 Drawing Sheets

CHARGE-TO-VOLTAGE CONVERTER WITH ADJUSTABLE CONVERSION FACTOR

This is a continuation, of application Ser. No. 08/566,476 filed Dec. 4, 1995 now abandoned which is a continuation of Ser. No. 08/323,052 filed Oct. 12, 1994 now abandoned which is a continuation of Ser. No. 08/026,017 filed Mar. 4, 1993, now abandoned.

FIELD OF THE INVENTION

The present invention relates to a charge-to-voltage converter for converting signal charge packets transferred thereto from a charge transfer region into a signal voltage. In particular, it relates to a charge-to-voltage converter of a floating diffusion output type and a floating gate output type.

In a horizontal charge transfer region of a CCD area sensor or in a charge transfer region of a CCD delay line, a charge-to-voltage converter of a floating diffusion output type or a floating gate output type is employed as an output circuit for detecting input signal charge packets obtained from a charge transfer region and converting such signal charge packets into a signal voltage.

As shown in FIG. 5, in a conventional charge-to-voltage converter of a floating diffusion output type, a positive pulse is applied to a precharge gate 7 to switch on the PG 7, so that a potential in an floating diffusion (FD) region 1 can be used as a precharge voltage Vpd applied to a precharge drain (PD) region 2. Subsequently, in a state where the precharge gate is switched off, the signal charge packets transferred from a CCD transfer region 3 are injected into the FD region 1 via an output gate (OG). A signal voltage is produced by detecting the signal potential variation caused in the FD region 1.

Meanwhile as shown in FIG. 6, in another conventional charge-to-voltage converter of a floating gate output type, an floating gate (FG) 4 is provided on a substrate and is partially overlapped by output gate (OG) of a CCD transfer register 3, and the switching (on/off) action of a MOS transistor 5 is controlled by reset clock pulses $\phi$ reset of a predetermined period, so that the FG 4 can be reset periodically to a reset voltage Vreset. A signal voltage is obtained by utilizing the potential variation caused in the FG 4 in accordance with the signal charge passed through the channel under the FG 4.

However, in the conventional charge-to-voltage converter of a floating diffusion output type and a floating gate output type mentioned above, the capacitance of the converter is of a fixed value. It is, therefore, impossible to selectively change the charge-to-voltage conversion factor of the converter, and the conversion factor is determined merely as a single value as follows.

With regard to the signal charge quantity Q, the signal amplitude V in the FD region 1 (in FIG. 5) and 11 (in FIG. 6) is expressed as $$V=Q/C=Ne-/C \tag{1}$$

where N is the number of electrons; e-denotes an elemental charge (-1.6×10-19[C]); and C is the capacitance of the FD region 1 (in FIG. 5) and 11 (in FIG. 6).

Therefore the conversion factor $\eta H$, i.e., the signal amplitude obtained at the time of input of one electron to the FD region 1 (in FIG. 5) and 11 (in FIG. 6), is given by $$\eta H=V/N=e-/C \tag{2}$$

As a result, if the conversion factor is once set to a great value in design, the amplitude of the converted voltage is rendered excessively high when a large quantity of signal charge packets is input. Consequently such amplitude exceeds the maximum allowable limit of the converter to eventually raise a problem that proper charge-to-voltage conversion fails to be executed, whereby a sufficient dynamic range of conversion is not achievable.

To the contrary, if the conversion factor of the converter is set to a small value in design for the purpose of complying with a large quantity of input signal charge packets as well, the amplitude of the converted voltage is rendered excessively low when the input signal charge packets are small in quantity. Harmful influence of noise is prone to be induced by the excessively low voltage which eventually raises a problem in practical use. In this case also, therefore, a sufficient dynamic range of conversion is not achievable either.

SUMMARY OF THE INVENTION

In view of the circumstances mentioned, it is an object of the present invention to provide an improved charge-to-voltage converter which is changeable of the charge-to-voltage conversion factor of the converter by changing the capacitance of the floating diffusion or floating gate.

It is another object of the present invention to provide an improved charge-to-voltage converter which is capable of realizing a sufficiently wide dynamic range in the conversion to comply with any state where the input signal charge packets are extremely small or great in quantity.

In one aspect of the present invention, there is provided a charge-to-voltage converter of a floating diffusion output type for producing a signal voltage by injecting signal charge packets transferred from a charge transfer region into a floating diffusion region via an output gate. The converter includes a precharge drain region which is supplied with a reset voltage, a diffusion region which is formed between the floating diffusion through a first channel region and the precharge drain region through a second channel region, a first precharge gate electrode which is formed on the first channel region and a second precharge gate electrode which is formed on the second channel region.

In another aspect of the present invention, there is provided a charge-to-voltage converter of a floating gate output type for producing a signal voltage out of signal charge packets transferred thereto from a charge transfer region by detecting a potential variation in a floating gate provided on a substrate and is partially overlapped by output gate electrode of the charge transfer register. The converter includes a first diffusion region which is supplied with a reset voltage, a plurality of diffusion regions which are formed between the floating gate and the first diffusion region through a first channel region, at least one channel region which are formed between the diffusion regions and a plurality of reset gate electrodes which are formed on the first channel region and the at least one channel region.

In accordance with the present invention, since the capacitance of the floating diffusion or floating gate is changeable, hence achieving advantageous effects that the dynamic range of conversion can be widened. Therefore, when the invention is applied to a CCD imager or the like, a remarkable compliance is attainable in any state where the quantity of input light is extremely small or great.

BRIEF DESCRIPTION OF THE DRAWINGS

The invention will be more readily understood with reference to the accompanying drawings, wherein:

FIGS. 3(a)–3(c) show the constitution of a third embodiment of the present invention applied to a floating gate output type, in which (a) is a pattern diagram seen from above, and (b) is an equivalent circuit diagram thereof;

FIGS. 4(a)–4(c) show the constitution of a fourth embodiment of the present invention applied to a floating gate output type, in which (a) is a pattern diagram seen from above, and (b) is an equivalent circuit diagram thereof;

FIGS. 6(a)–6(c) show the constitution of another conventional example of a floating gate output type, in which (a) is a pattern diagram seen from above, and (b) is an equivalent circuit diagram thereof.

DETAILED DESCRIPTION OF THE PREFERRED EMBODIMENTS

Figure 5A:
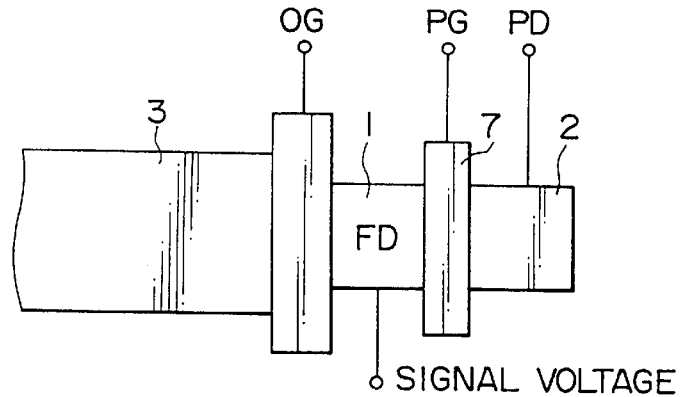
FIGS. 5(a)–5(c) show the constitution of a conventional example of a floating diffusion output type, in which (a) is a pattern diagram seen from above, (b) is a sectional view thereof, and (c) is an equivalent circuit diagram thereof.
Figure 5B:
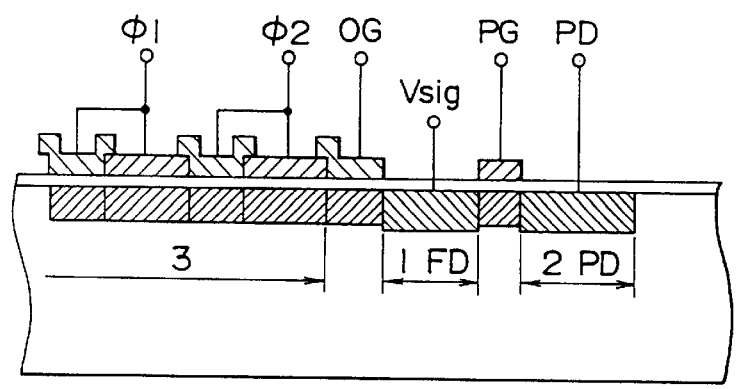
Figure 5C:
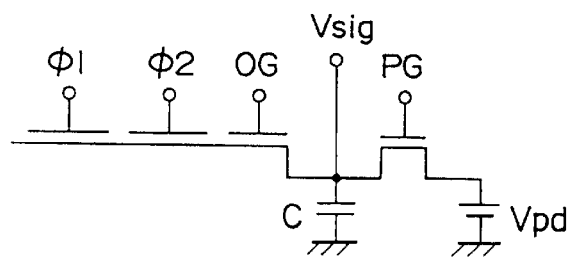
Figure 6A:
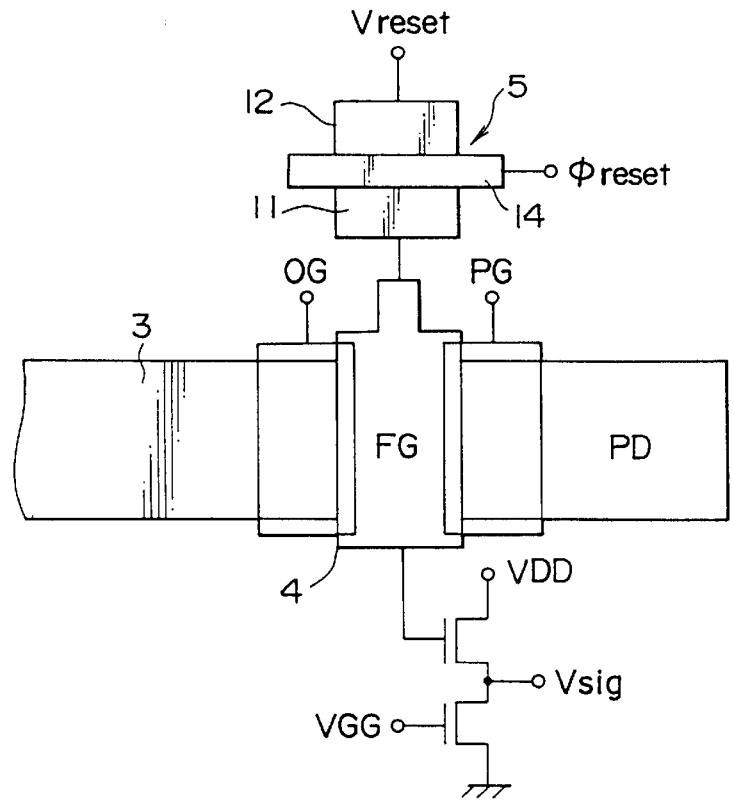
Figure 6B:
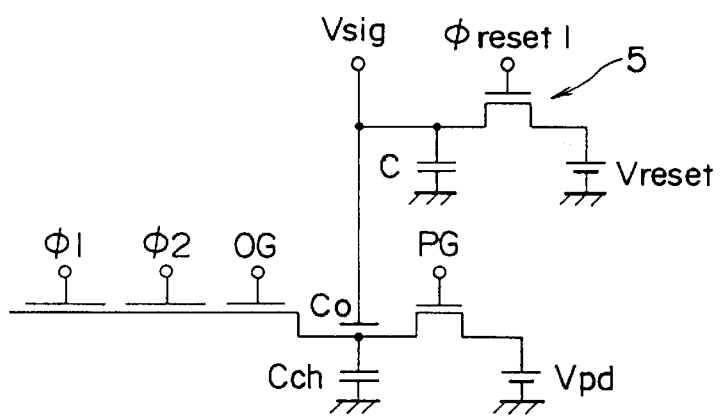

The preferred embodiments of the present invention will be described in detail by referring to FIGS. 1 to 4. In these drawings, the same reference numerals are utilized as shown in FIG. 5 and FIG. 6 so far as the same portions are referred.

Figure 1A:
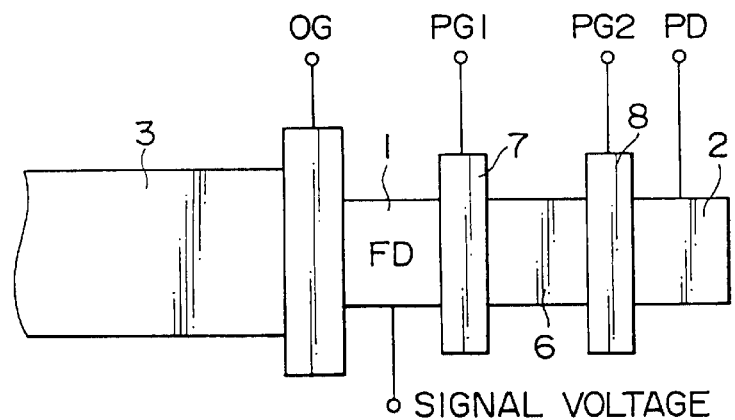
FIGS. 1(a)–1(c) show the constitution of a first embodiment of the present invention applied to a floating diffusion output type, in which (a) is a pattern diagram seen from above, (b) is a sectional view thereof, and (c) is an equivalent circuit diagram thereof.
Figure 1B:
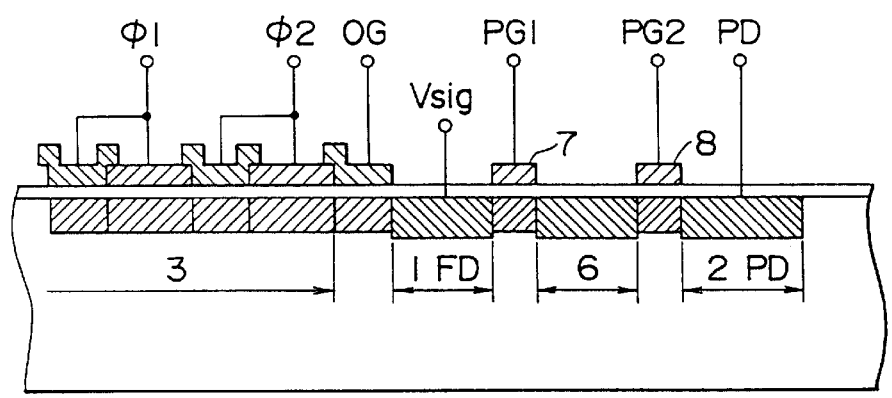
Figure 1C:
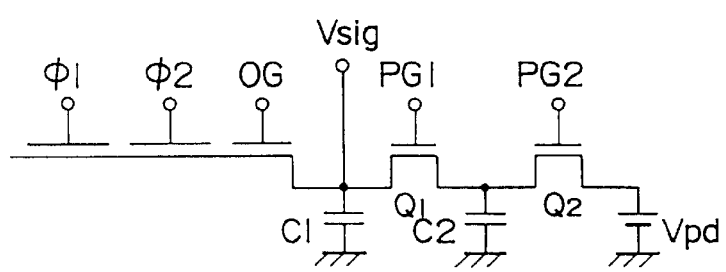

FIG. 1 shows the constitution of a first embodiment of the present invention applied to a floating diffusion output type. In this embodiment, a diffusion region 6 is formed adjacent to an FD region 1 through a channel region, and a precharge drain (PD) region 2 is formed adjacent to the diffusion region 6 through a channel region. Further two precharge gates 7, 8 are formed on the channel regions respectively between such diffusion regions 1 & 6 and 6 & 2 to thereby constitute two MOS transistors (switch elements) Q1 and Q2.

The charge-to-voltage conversion factor of the converter can be selectively changed by controlling the switching (on/off) actions of the two MOS transistors Q1 and Q2 in accordance with gate pulses PG1 and PG2 respectively.

(1) In Raising the Conversion Factor:
  Q1 is turned on or off by gate pulses PG1 corresponding to the conventional gate pulses PG.
  Q2 is kept in its on-state.
(2) In Lowering the Conversion Factor:
  Q1 is kept in its on-state.
  Q2 is turned on or off by gate pulses PG2 corresponding to the conventional gate pulses PG.

The conversion factor is changeable in the following manner by selectively setting the two MOS transistors Q1 and Q2 as mentioned above.

(1) In Raising the Conversion Factor:
  With regard to the signal charge quantity Q, the signal amplitude VH in the FD region 1 is expressed as $$VH=Q/C1=Ne-/C1 \quad (3)$$

where N is the number of electrons; e- denotes an elemental charge ($-1.6 \times 10^{-19}$[C]); and C1 is the capacitance of the FD region 1.

Therefore the conversion factor $\eta H$, i.e., the signal amplitude obtained at the time of input of one electron to the FD region 1, is given by $$\eta H=VH/N=e-/C1 \quad (4)$$

(2) In Lowering the Conversion Factor:
  Under the same conditions as those in (3), the signal amplitude VL in the FD region 1 is expressed as $$VL=Q/(C1+C2)=Ne-/(C1+C2) \quad (5)$$

where C2 is the capacitance of the diffusion region 6. The conversion factor $\eta L$ is given by $$\eta L=VL/N=e-/(C1+C2) \quad (6)$$

As apparent from the above, $$\eta H > \eta L \quad (7)$$

Consequently it becomes possible to select either of two conversion factors by controlling the switching (on/off) actions of the two MOS transistors Q1, Q2 under external control of the terminal voltages PG1, PG2 of the precharge gates 7, 8.

Figure 2A:
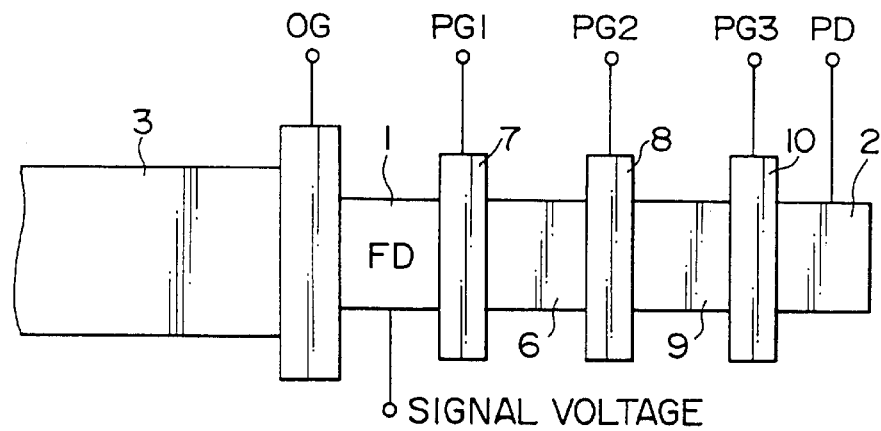
FIGS. 2(a)–2(c) show the constitution of a second embodiment of the present invention applied to a floating diffusion output type, in which (a) is a pattern diagram seen from above, (b) is a sectional view thereof, and (c) is an equivalent circuit diagram thereof.
Figure 2B:
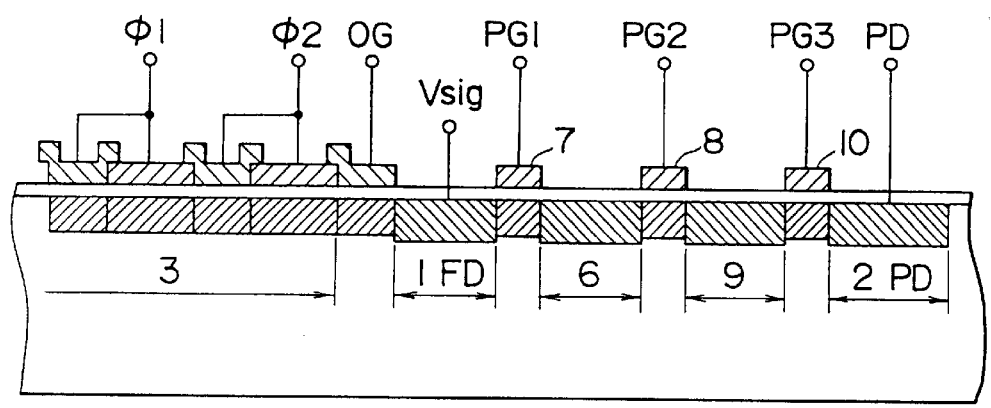
Figure 2C:
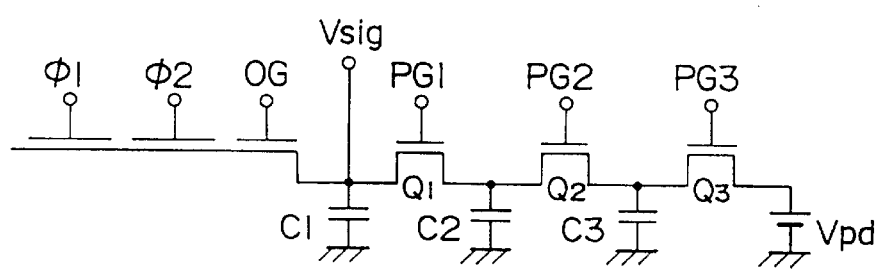

FIG. 2 shows the constitution of a second embodiment of the present invention applied to a floating diffusion output type. In the second embodiment, two diffusion regions 6, 9 are formed adjacent to an FD region 1 through channel regions respectively. A PD region 2 is formed adjacent to the outer diffusion region 9 through a channel region. Further three precharge gates 7, 8, 10 are formed on the channel regions respectively between such diffusion regions 1 & 6, 6 & 9 and 9 & 2 to thereby constitute three MOS transistors Q1, Q2, Q3.

The charge voltage conversion factor of the converter can be selectively changed by controlling the switching (on/off) actions of the three MOS transistors Q1, Q2, Q3 in accordance with gate pulses PG1, PG2, PG3 respectively.

(1) In Raising the Conversion Factor to the Maximum:
  Q1 is turned on or off by gate pulses PG1 corresponding to the conventional gate pulses PG.
  Q2 is kept in its on-state.
  Q3 is also kept in its on-state.
(2) In Setting the Conversion Factor to an Intermediate Value:
  Q1 is kept in its on-state.
  Q2 is turned on or off by gate pulses PG2 corresponding to the conventional gate pulses PG.
  Q3 is kept in its on-state.
(3) In Lowering the Conversion Factor to the Minimum:
  Q1 is kept in its on-state.
  Q2 is also kept in its on-state.
  Q3 is turned on or off by gate pulses PG3 corresponding to the conventional gate pulses PG.

The conversion factor is chargeable in the following manner by selectively setting the three MOS transistors Q1, Q2, Q3 as mentioned above.

(1) In Raising the Conversion Factor to the Maximum:

$$VH=Ne-/C1$$

$$\eta H=e-/C1 \quad (8)$$

(2) In Setting the Conversion Factor to an Intermediate Value:

$$VM=Ne-/(C1+C2)$$

$$\eta M=e-/(C1+C2) \quad (7)$$

(3) In Lowering the Conversion Factor to the Minimum:

$$VL=Ne-/(C1+C2+C3)$$

$$\eta L=e-/(C1+C2+C3) \quad (8)$$

where C3 is the capacitance of the diffusion region 9.

As apparent from the above, $$\eta H > \eta M > \eta L \quad (9)$$

Consequently it also becomes possible to select any of three conversion factors by controlling the switching (on/off) actions of the three MOS transistors Q1, Q2, Q3 under external control of the terminal voltages PG1, PG2, PG3 of the precharge gates 7, 8, 10.

Figure 3A:
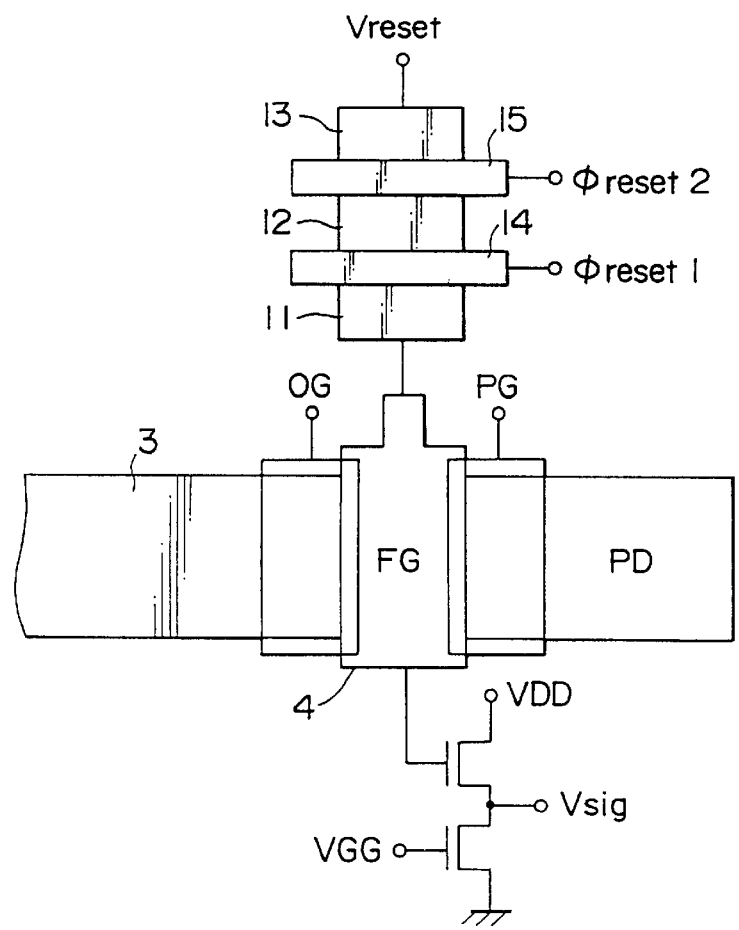
Figure 3B:
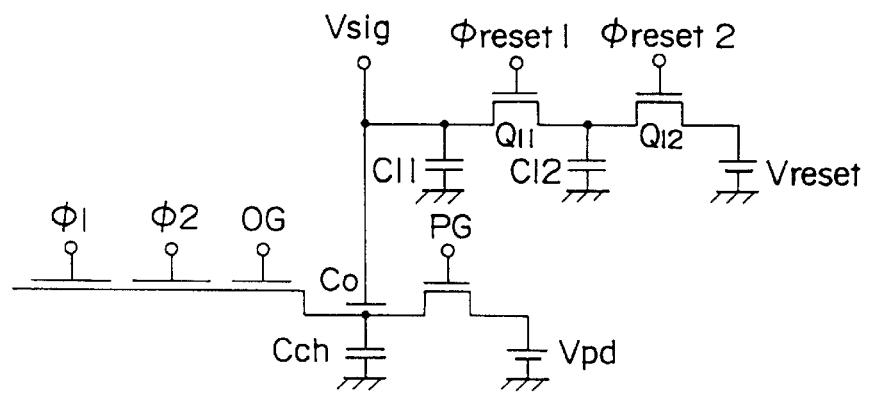

FIG. 3 shows the constitution of a third embodiment of the present invention applied to a floating gate output type. In this embodiment, switch elements for resetting an FG 4 at a reset voltage Vreset in a predetermined period (φ reset) consist of two MOS transistors Q11, Q12 which are composed of three diffusion regions 11–13 formed adjacent to one another through channel regions, and two gate electrodes 14, 15 formed on the channel regions between such diffusion regions 11–13 respectively, wherein the diffusion region 11 at one end is connected to the FG 4, and the reset voltage Vreset is applied to the diffusion region 13 at the other end.

The charge-to-voltage conversion factor of the converter can be selectively changed by controlling the switching (on/off) actions of the two MOS transistors Q11 and Q12 in accordance with gate pulses φ reset1 and φ reset2.

(1) In Raising the Conversion Factor:

Q11 is turned on or off by gate pulses φ reset1 corresponding to the conventional gate pulses φ reset.

Q12 is kept in its on-state.

(2) In Lowering the Conversion Factor:

Q11 is kept in its on-state.

Q12 is turned on or off by gate pulses φ reset2 corresponding to the conventional gate pulses φ reset.

The conversion factor is changeable in the following manner by selectively setting the two MOS transistors Q11 and Q12 as mentioned above. In the following calculations, the channel capacitance Cch is ignored since its value is negligibly small. However, there occurs essentially no difference at all even if its value is great.

(1) In Raising the Conversion Factor:

With regard to the signal charge quantity Qc, the signal amplitude VH in the FD region 1 is expressed as $$VH=Q/C11=Ne-/C11$$

$$\eta H=e-/C11 \quad (10)$$

where C11 is the capacitance of the diffusion region 11.

(2) In Lowering the Conversion Factor:

$$VL=Q/(C11+C12)=Ne-/(C11+C12)$$

$$\eta L=e-/(C11+C12) \quad (11)$$

where C12 is the capacitance of the diffusion region 12.

As apparent from the above, $$\eta H > \eta L \quad (12)$$

Consequently it also becomes possible to select either of two conversion factors by controlling the switching (on/off) actions of the two MOS transistors Q11, Q12 under external control of the terminal voltages φ reset1, φ reset2 of the gates 14, 15.

Figure 4A:
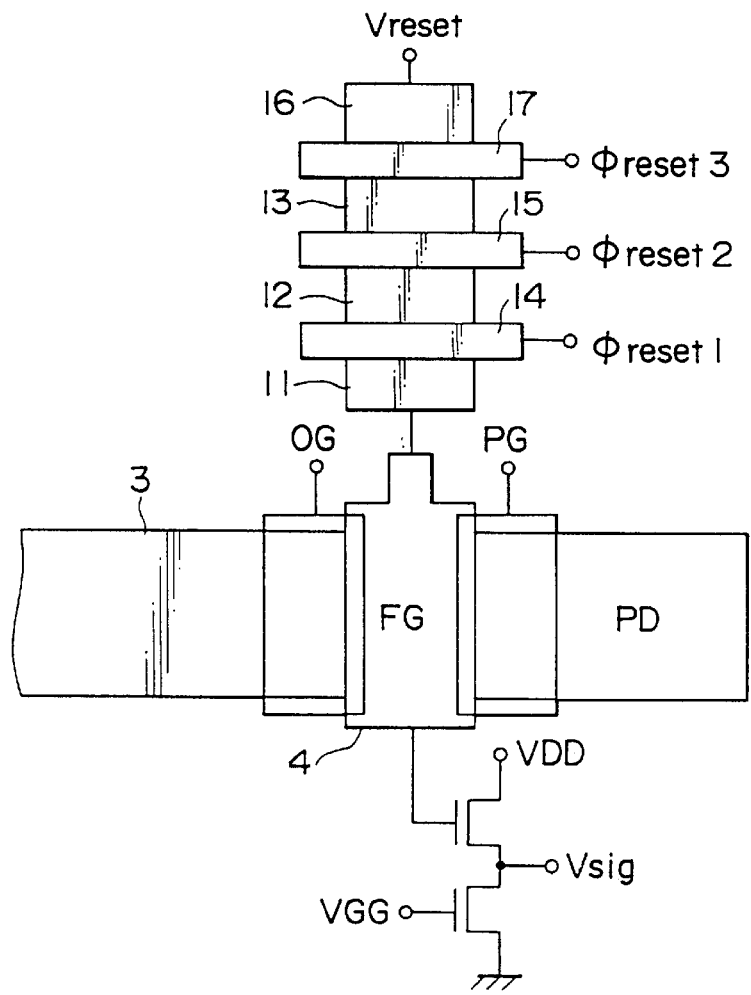
Figure 4B:
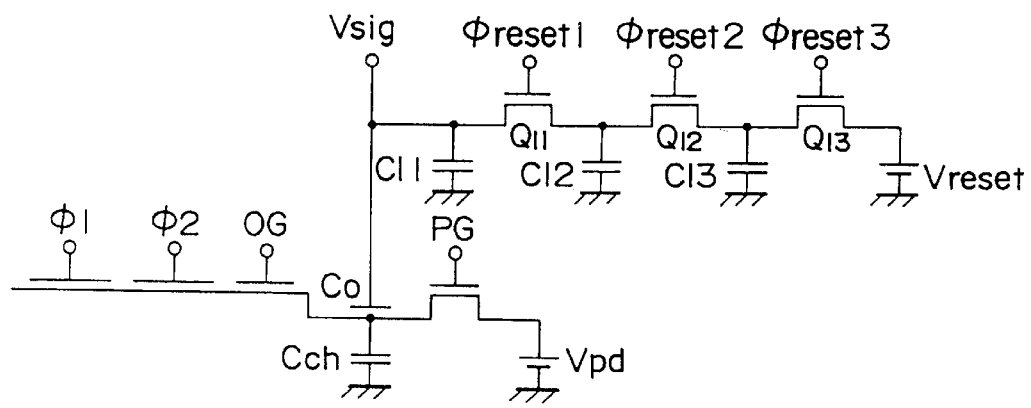

FIG. 4 shows the constitution of a fourth embodiment of the present invention applied to a floating gate output type. In this embodiment, a diffusion region 16 and a gate electrode 17 are provided in addition to the structure of the foregoing third embodiment to thereby increase another MOS transistor. And thus the switch elements for resetting the FG 4 at the reset voltage Vreset in a predetermined period (φ reset) are composed of three MOS transistors Q11, Q12 and Q13.

The charge-to-voltage conversion factor of the converter can be selectively changed by controlling the switching (on/off) actions of the three MOS transistors Q11, Q12 and Q13 as follows in accordance with gate pulses φ reset1, φ reset2 and φ reset3 respectively.

(1) In Raising the Conversion Factor to the Maximum:

Q11 is turned on or off by gate pulses φ reset1 corresponding to the conventional gate pulses φ reset.

Q12 is kept in its on-state.

Q13 is also kept in its on-state.

(2) In Setting the Conversion Factor to an Intermediate Value:

Q11 is kept in its on-state.

Q12 is turned on or off by gate pulses φ reset2 corresponding to the conventional gate pulses φ reset.

Q13 is kept in its on-state.

(3) In Lowering the Conversion Factor to the Minimum:

Q11 is kept in its on-state.

Q12 is also kept in its on-state.

Q13 is turned on or off by gate pulses φ reset3 corresponding to the conventional gate pulses φ reset.

The conversion factor is changeable as follows by the setting mentioned above. In the following equations, the channel capacitance Cch has been ignored since its value is negligibly small. However, there occurs essentially no difference at all even if its value is great.

(1) In Raising the Conversion Factor to the Maximum:

$$VH=Ne-/C11$$

$$\eta H=e-/C11 \quad (13)$$

(2) In Setting the Conversion Factor to an Intermediate Value:

$$VM=Ne-/(C11+C12)$$

$$\eta M=e-/(C11+C12) \quad (14)$$

(3) In Lowering the Conversion Factor to the Minimum:

$$VL=Ne-/(C11+C12+C13)$$

$$\eta L=e-/(C11+C12+C13) \quad (15)$$

where C13 is the capacitance of the diffusion region 16.

As apparent from the above, $$\eta H > \eta M > \eta L \quad (16)$$

Consequently it also becomes possible to select any of three conversion factors by controlling the switching (on/off) actions of the three MOS transistors Q11, Q12, Q13 under external control of the terminal voltages φ reset1, φ reset2, φ reset3 of the gates 14, 15, 17.

In the embodiments mentioned above, one or two diffusion regions are formed in addition to the known structure in the prior art to thereby constitute an improvement with an increase of one or two MOS transistors. However, it is to be understood that the present invention is not limited to such embodiments alone. For example, three or more diffusion regions may be added to further increase the number of MOS transistors.

What is claimed is:

1. A charge-to-voltage converter of a floating diffusion output type for producing a signal voltage by injecting signal charge packets transferred from a charge transfer region into a floating diffusion region via an output gate, said converter comprising:

a precharge drain region supplied with a reset voltage;

a floating diffusion region;

a plurality of diffusion regions formed between said floating diffusion region and said precharge drain region, only one of said diffusion regions being directly adjacent said floating diffusion region;

first and second channel regions formed between adjacent ones of said diffusion regions;

a first precharge gate electrode formed over said first channel region;

a second precharge gate electrode formed over said second channel region; and the charge-to-voltage conversion factor being selectively changed in response to gate voltages selectively applied to said first and second precharge gate electrodes and wherein said floating diffusion region is connected only to the output gate, said first precharge gate and an output terminal.

* * * * *